United States Patent
Chiang et al.

(10) Patent No.: US 8,097,344 B2
(45) Date of Patent: Jan. 17, 2012

(54) ELECTRONIC DEVICE HOUSING

(75) Inventors: Chwan-Hwa Chiang, Taipei Hsien (TW); Qi-Jian Du, Shenzhen (CN)

(73) Assignees: Shenzhen Futaihong Precision Industry Co., Ltd., ShenZhen, Guangdong Province (CN); FIH(Hong Kong) Limited, Kowloon (HK)

( * ) Notice: Subject to any disclaimer, the term of this patent is extended or adjusted under 35 U.S.C. 154(b) by 0 days.

(21) Appl. No.: 12/949,942

(22) Filed: Nov. 19, 2010

(65) Prior Publication Data
US 2011/0159275 A1    Jun. 30, 2011

(30) Foreign Application Priority Data
Dec. 25, 2009    (CN) .......................... 2009 1 0312293

(51) Int. Cl.
*B32B 9/00*    (2006.01)

(52) U.S. Cl. ......... 428/469; 428/472; 428/701; 428/702

(58) Field of Classification Search ................... 428/699, 428/701, 702
See application file for complete search history.

(56) References Cited

U.S. PATENT DOCUMENTS

| | | | |
|---|---|---|---|
| 2005/0277543 A1* | 12/2005 | Takahashi et al. | 502/100 |
| 2007/0000407 A1* | 1/2007 | Leong | 106/15.05 |
| 2007/0264494 A1* | 11/2007 | Krisko et al. | 428/336 |

FOREIGN PATENT DOCUMENTS

JP    2007185616    * 7/2007

OTHER PUBLICATIONS

Yamaguchi JP 2007185616 English Machine translation.*

* cited by examiner

*Primary Examiner* — Timothy Speer
(74) *Attorney, Agent, or Firm* — Altis Law Group, Inc.

(57) ABSTRACT

An electronic device housing is provided. The electronic device housing includes a substrate, a metallic coating formed on the substrate, and a top paint coating formed on the metallic coating. The top paint coating contains nano-titanium dioxide powder. The top paint coating has a self-cleaning property. It can oxygenize and clean off dust and sweat accumulated on the surface of the electronic device housing.

15 Claims, 1 Drawing Sheet

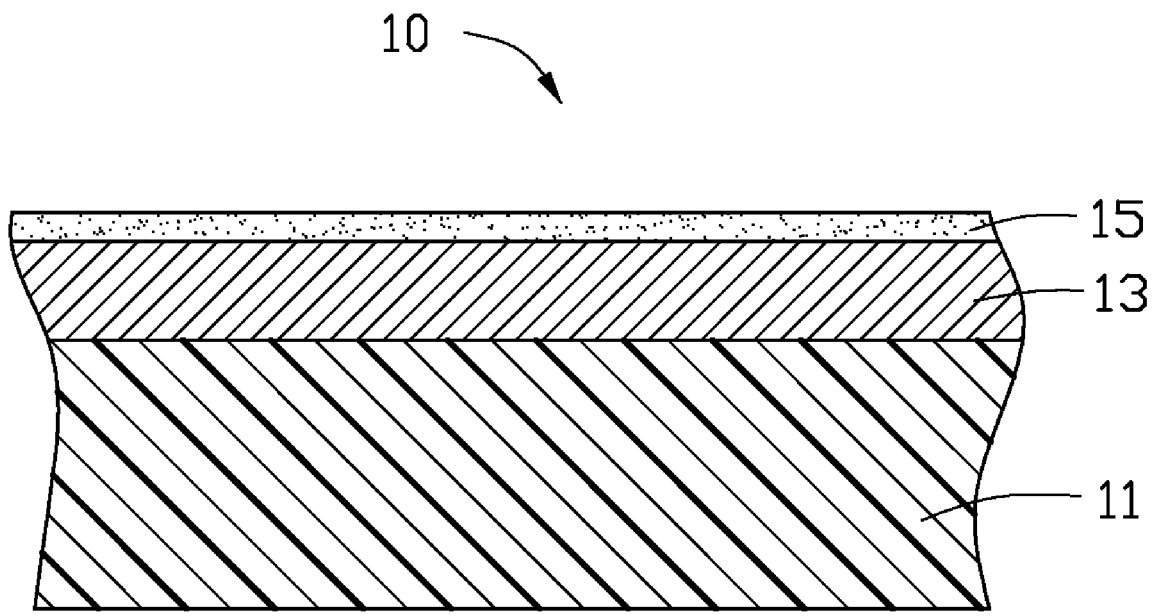

ELECTRONIC DEVICE HOUSING

CROSS-REFERENCE TO RELATED APPLICATIONS

This application is one of the three related co-pending U.S. patent applications listed below. All listed applications have the same assignee. The disclosure of each of the listed applications is incorporated by reference into all the other listed applications.

| Attorney Docket No. | Title | Inventors |
| --- | --- | --- |
| 12/949,934 US 31521 | ELECTRONIC DEVICE HOUSING AND METHOD FOR MAKING THE SAME | QI-JIAN DU et al. |
| US 31523 12/949,942 | ELECTRONIC DEVICE HOUSING | QI-JIAN DU et al. |
| US 31998 12/949,947 | ELECTRONIC DEVICE HOUSING | QI-JIAN DU et al. |

BACKGROUND

1. Technical Field

The present disclosure relates to electronic device housings, particularly to an electronic device housing having a self-cleaning property.

2. Description of Related Art

Decorative metallic coatings are often formed on housings of electronic devices. The metallic coatings are typically formed by vacuum deposition for an aesthetic metallic appearance. The metallic coatings formed by vacuum deposition can be nonconductive so as not to block electromagnetic waves. However, the metallic coatings are not self-cleaning, and cannot repel dust and sweat that collects on the electronic device housings.

Therefore, there is room for improvement within the art.

BRIEF DESCRIPTION OF THE FIGURE

Many aspects of the electronic device housing can be better understood with reference to the following FIGURE. The components in the FIGURE are not necessarily drawn to scale, the emphasis instead being placed upon clearly illustrating the principles of the electronic device housing.

The FIGURE is a cross-section of an embodiment of an electronic device housing.

DETAILED DESCRIPTION

The FIGURE shows an electronic device housing 10 according to an embodiment. The electronic device housing 10 includes a substrate 11, a metallic coating 13 formed on a surface of the substrate 11, and a top paint coating 15 formed on the metallic coating 13. The electronic device housing 10 may be a housing of a mobile phone, PDA, note book computer, MP3, MP4, GPS navigator, or digital camera.

The substrate 11 may be formed by molding one or more plastics such as polycarbonate (PC), polyethylene (PE), polymethyl methacrylate (PMMA), and a mixture of polycarbonate and acrylonitrile-butadiene-styrene plastics (PC+ABS). The substrate 11 may instead be made of glass or ceramic.

The metallic coating 13 may be a titanium dioxide coating, a composite coating formed of a titanium dioxide coating and a silicon dioxide coating, or another composite coating consisting of a titanium dioxide coating, a silicon dioxide coating, and another metallic oxide coating such as a niobium oxide coating, a zirconium oxide coating, an aluminum oxide coating, and a tantalum oxide coating. If the metallic coating 13 contains the metallic oxide coating, the exterior layer of the metallic coating 13 should be the titanium dioxide coating or the silicon dioxide coating for enhancing the bonding between the metallic coating 13 and the top paint coating 15.

The metallic coating 13 may be formed by vacuum sputtering or vacuum vapor deposition. The thickness of the metallic coating 13 may be in a range of about 10 nm to about 500 nm. The thickness of the metallic coating 13 is determined by how much is needed for presenting a metallic appearance without interfering with radio transmission capabilities.

The top paint coating 15 may be formed on the metallic coating 13 by spray painting. The paint component for the paint coating 15 may be acrylic resin paint, epoxy resin paint, polyurethane resin paint, or phenolic resin paint. Further, the paint contains nano-titanium dioxide powder and nano-silicon dioxide powder. The top paint coating 15 includes the nano-titanium dioxide powder and the nano-silicon dioxide powder at a mass percentage of about 5% to about 10%. The mass ratio of the nano-titanium dioxide powder to the nano-silicon dioxide powder may be about 3:1 to about 8:1. The nano-titanium dioxide powder may have an average particle size of less than 100 nm.

The top paint coating 15 may be transparent or translucent, and has a thickness of about 10 μm to about 50 μm. The top paint coating 15, even if containing nano-titanium dioxide powder and nano-silicon dioxide powder, can tightly bond to the metallic coating 13 because the metallic coating 13 has an exterior layer of titanium dioxide coating or silicon dioxide coating. In other words, the nano-titanium dioxide powder and nano-silicon dioxide powder contained in the top paint coating 15 is directly bonded to the titanium dioxide coating or the silicon dioxide coating of the metallic coating 13, thus enhancing the bond between the top paint coating 15 and the metallic coating 13.

The top paint coating 15 has a self-cleaning property. Specifically, during irradiation under visible light or ultraviolet light, the nano-titanium dioxide contained in the top paint coating 15 can oxygenize and clean off dust and sweat that have accumulated on the surface of the top paint coating 15.

It should be understood, however, that though numerous characteristics and advantages of the present embodiments have been set forth in the foregoing description, together with details of functions of the embodiments, the disclosure is illustrative only, and changes may be made in detail within the principles of the disclosure to the full extent indicated by the broad general meaning of the terms in which the appended claims are expressed.

What is claimed is:

1. An electronic device housing, comprising:
    a substrate;
    a metallic coating formed on the substrate, the metallic coating comprising titanium dioxide or titanium dioxide and silicon dioxide; and
    a top paint coating made of paint formed on the metallic coating;
    wherein the top paint coating comprises nano-titanium dioxide powder.

2. The electronic device housing as claimed in claim 1, wherein the nano-titanium dioxide powder has an average particle size of less than 100 nm.

3. The electronic device housing as claimed in claim 1, wherein the top paint coating further comprises nano-silicon dioxide powder and paint component.

4. The electronic device housing as claimed in claim 3, wherein the nano-titanium dioxide powder and the nano-silicon dioxide powder have a mass ratio of about 3:1 to about 8:1.

5. The electronic device housing as claimed in claim 3, wherein the top paint coating comprises the nano-titanium dioxide powder and the nano-silicon dioxide powder at a mass percentage of about 5% to about 10%.

6. The electronic device housing as claimed in claim 3, wherein the paint component comprises acrylic resin, epoxy resin, polyurethane resin, or phenolic resin.

7. The electronic device housing as claimed in claim 1, wherein the top paint coating has a thickness of about 10 μm to about 50 μm.

8. The electronic device housing as claimed in claim 1, wherein the metallic coating is formed by vacuum sputtering or vacuum vapor deposition.

9. The electronic device housing as claimed in claim 8, wherein the metallic coating is a titanium dioxide coating.

10. The electronic device housing as claimed in claim 8, wherein the metallic coating is a composite coating formed of a titanium dioxide coating and a silicon dioxide coating.

11. The electronic device housing as claimed in claim 8, wherein the metallic coating is a composite coating comprising of a titanium dioxide coating, a silicon dioxide coating, and another metallic oxide coating selected from the group consisting of a niobium oxide coating, a zirconium oxide coating, an aluminum oxide coating, and a tantalum oxide coating.

12. The electronic device housing as claimed in claim 11, wherein the metallic coating has an exterior layer of titanium dioxide coating or silicon dioxide coating, and the top paint coating bonds with the titanium dioxide coating or the silicon dioxide coating.

13. The electronic device housing as claimed in claim 8, wherein the metallic coating has a thickness of about 10 nm to about 500 nm.

14. The electronic device housing as claimed in claim 1, wherein the substrate is made of plastic, glass, or ceramic.

15. The electronic device housing as claimed in claim 14, wherein the plastic is one or more materials selected from the group consisting of polycarbonate, polyethylene, polymethyl methacrylate, and a mixture of polycarbonate and acrylonitrile-butadiene-styrene plastics.

\* \* \* \* \*